United States Patent
Wang et al.

(10) Patent No.: US 9,952,279 B2
(45) Date of Patent: *Apr. 24, 2018

(54) APPARATUS FOR THREE DIMENSIONAL INTEGRATED CIRCUIT TESTING

(71) Applicant: Taiwan Semiconductor Manufacturing Company, Ltd., Hsin-Chu (TW)

(72) Inventors: Mill-Jer Wang, Hsin-Chu (TW); Ching-Nen Peng, Hsin-Chu (TW); Hung-Chih Lin, Hsin-Chu (TW); Hao Chen, Luzhou (TW); Chung-Han Huang, New Taipei (TW); Chung-Sheng Yuan, Hsin-Chu (TW); Ching-Fang Chen, Taichung (TW); Wen-Wen Hsieh, New Taipei (TW); Meng-Lin Chung, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 381 days.

This patent is subject to a terminal disclaimer.

(21) Appl. No.: 13/724,004

(22) Filed: Dec. 21, 2012

(65) Prior Publication Data

US 2014/0176165 A1 Jun. 26, 2014

(51) Int. Cl.
*G01R 31/28* (2006.01)
*G01R 1/073* (2006.01)

(52) U.S. Cl.
CPC ...... *G01R 31/2889* (2013.01); *G01R 1/07378* (2013.01)

(58) Field of Classification Search
None
See application file for complete search history.

(56) References Cited

U.S. PATENT DOCUMENTS 5,426,563 A * 6/1995 Moresco ............... H01L 21/486
257/E23.065
6,586,515 B1 7/2003 Koike
(Continued)

FOREIGN PATENT DOCUMENTS

CN 1257209 C 5/2006
CN 1847869 10/2006
(Continued)

OTHER PUBLICATIONS

Marinissen, E.J., "Testing TSV-Based Three-Dimensional Stacked ICs," Design, Automation & Test in Europe Conference & Exhibition, Conference Publications, Mar. 8-12, 2010, pp. 1689-1694.

*Primary Examiner* — Paresh Patel
(74) *Attorney, Agent, or Firm* — Slater Matsil, LLP

(57) ABSTRACT

A three-dimensional integrated circuit testing apparatus comprises a probe card configured to couple a device-under-test of a three-dimensional integrated circuit with an automatic testing equipment board having a plurality of testing modules, wherein the probe card comprises a plurality of known good dies of the three-dimensional integrated circuit, a plurality of interconnects of the three-dimensional integrated circuit and a plurality of probe contacts, wherein the probe contacts are configured to couple the probe card with testing contacts of the device-under-test of the three-dimensional integrated circuit.

19 Claims, 15 Drawing Sheets

(56) References Cited

U.S. PATENT DOCUMENTS

| | | | |
|---|---|---|---|
| 6,727,723 | B2 | 4/2004 | Shimizu et al. |
| 6,946,859 | B2 * | 9/2005 | Karavakis ............ G01R 1/0483 324/754.18 |
| 7,863,918 | B2 * | 1/2011 | Jenkins .............. G01R 31/2884 324/750.3 |
| 8,362,796 | B2 * | 1/2013 | Pagani ............... G01R 31/3172 324/762.02 |
| 8,922,230 | B2 | 12/2014 | Wang et al. |
| 8,928,343 | B2 * | 1/2015 | Sellathamby et al. ... 324/754.01 |
| 8,957,691 | B2 * | 2/2015 | Wang et al. ............. 324/755.01 |
| 2002/0171449 | A1 | 11/2002 | Shimizu et al. |
| 2006/0232292 | A1 | 10/2006 | Shimizume et al. |
| 2007/0287265 | A1 | 12/2007 | Hatano et al. |
| 2008/0001305 | A1 | 1/2008 | Uchida |
| 2008/0106292 | A1 | 5/2008 | Chui et al. |
| 2009/0224784 | A1 * | 9/2009 | Pagani ............... G01R 31/3172 324/762.02 |

FOREIGN PATENT DOCUMENTS

| | | |
|---|---|---|
| CN | 101079372 | 11/2007 |
| CN | 101178414 A | 5/2008 |
| CN | 102778646 A | 11/2012 |

* cited by examiner

APPARATUS FOR THREE DIMENSIONAL INTEGRATED CIRCUIT TESTING

BACKGROUND

As semiconductor technologies evolve, three-dimensional integrated circuits emerge as an effective alternative to further reduce the physical size of a semiconductor chip. In a three-dimensional integrated circuit, active circuits are fabricated on different wafers and each wafer die is stacked on top of another wafer die using pick-and-place techniques. Much higher density can be achieved by employing vertical stacking of integrated circuits. Furthermore, three-dimensional integrated circuits can achieve smaller form factors, cost-effectiveness, increased performance and lower power consumption.

In the process of manufacturing three-dimensional integrated circuits, known good die (KGD) and known good stack (KGS) tests are often performed through various testing probe card at various stages during the manufacturing process. Probe cards are one type of test structure used to perform electrical tests. The probe card may be coupled between an automatic testing equipment board and a semiconductor die under test. The probe cards make contact to the semiconductor die through a plurality of probe contacts.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, namely a test solution for a three-dimensional integrated circuit comprising an interposer and a plurality of semiconductor dies stacked on the interposer. The embodiments of the disclosure may also be applied, however, to a variety of three-dimensional integrated circuits. Hereinafter, various embodiments will be explained in detail with reference to the accompanying drawings.

Figure 1A:
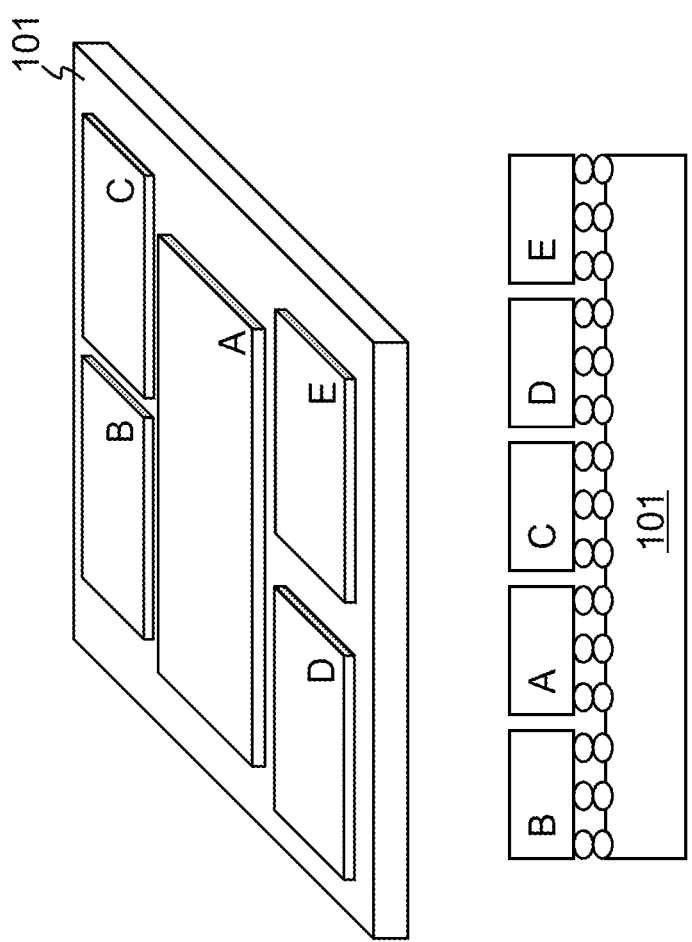
FIG. 1A illustrates a perspective view and a cross sectional view of a three-dimensional integrated circuit in accordance with various embodiments of the present disclosure.

FIG. 1A illustrates a perspective view and a cross sectional view of a three-dimensional integrated circuit in accordance with various embodiments of the present disclosure. As shown in the perspective view, the three-dimensional integrated circuit may comprise five semiconductor dies A, B, C, D and E bonded on an interposer 101 through a plurality of bumps (shown in the cross sectional view).

In some embodiments, semiconductor dies A, B, C, D and E are memory circuits, processors, logic circuits and/or the like. The semiconductor dies A, B, C, D and E may be coupled to each other through various interconnects (not shown) embedded in the interposer 101.

It should be noted while FIG. 1A illustrates five semiconductor dies A, B, C, D and E, the interposer 101 may accommodate any number of semiconductor dies. It should further be noted that the arrangement of the semiconductor dies on the interposer 101 is merely an example. A person skilled in the art will recognize that depending on different applications and designs, there may be a variety of configurations of the semiconductor dies on the interposer 101. For example, each semiconductor die (e.g., semiconductor die D) may be replaced by a plurality of semiconductor dies stacked together.

Figure 1B:
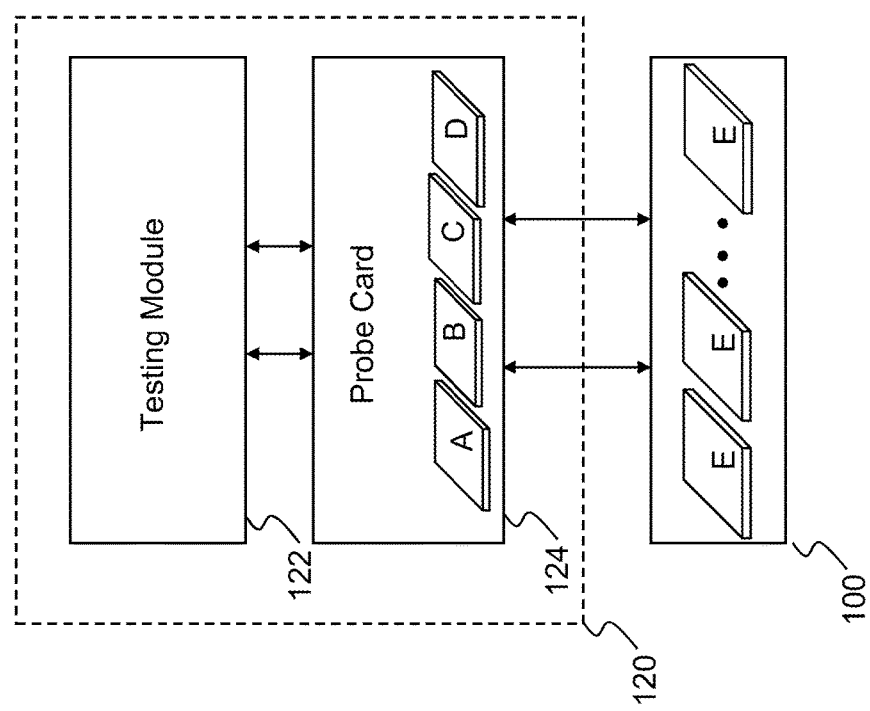
FIG. 1B illustrates a simplified block diagram of a three-dimensional integrated circuit testing apparatus in accordance with various embodiments of the present disclosure.

FIG. 1B illustrates a simplified block diagram of a three-dimensional integrated circuit testing apparatus in accordance with various embodiments of the present disclosure. Referring back to FIG. 1A, in order to improve the yield of three-dimensional integrated circuits, each semiconductor die may be probed for known good die (KGD) and known good stack (KGS) testing before it is stacked on the interposer 101.

In some embodiments, the semiconductor dies A, B, C and D are known good dies. In other words, they have passed various device and system level tests. The semiconductor die E is a device under test (DUT).

In some embodiments, semiconductor die E is formed in a wafer 100. Prior to a dicing process and a subsequent stacking process, a three-dimensional integrated circuit testing process is performed on the semiconductor dies E to verify system level characteristics. In order to test the system level performance of the semiconductor die E, semiconductor dies A, B, C and D are mounted on a testing substrate (not shown but illustrated in FIG. 2) of the probe card 124. In particular, the testing substrate may comprise the same interconnects as the interposer 101 shown in FIG. 1A. When the semiconductor die E operates in a testing mode, the three-dimensional integrated circuit testing apparatus 120 is coupled to the semiconductor die E via a plurality of testing channels such as probe contacts (not shown).

The probe card 124 is also coupled to an automatic test equipment board (ATE) 122 through a plurality of contacts. In the ATE 122, a plurality of testing modules (not shown) are employed for performing different tests of the semiconductor die E.

Figure 1C:
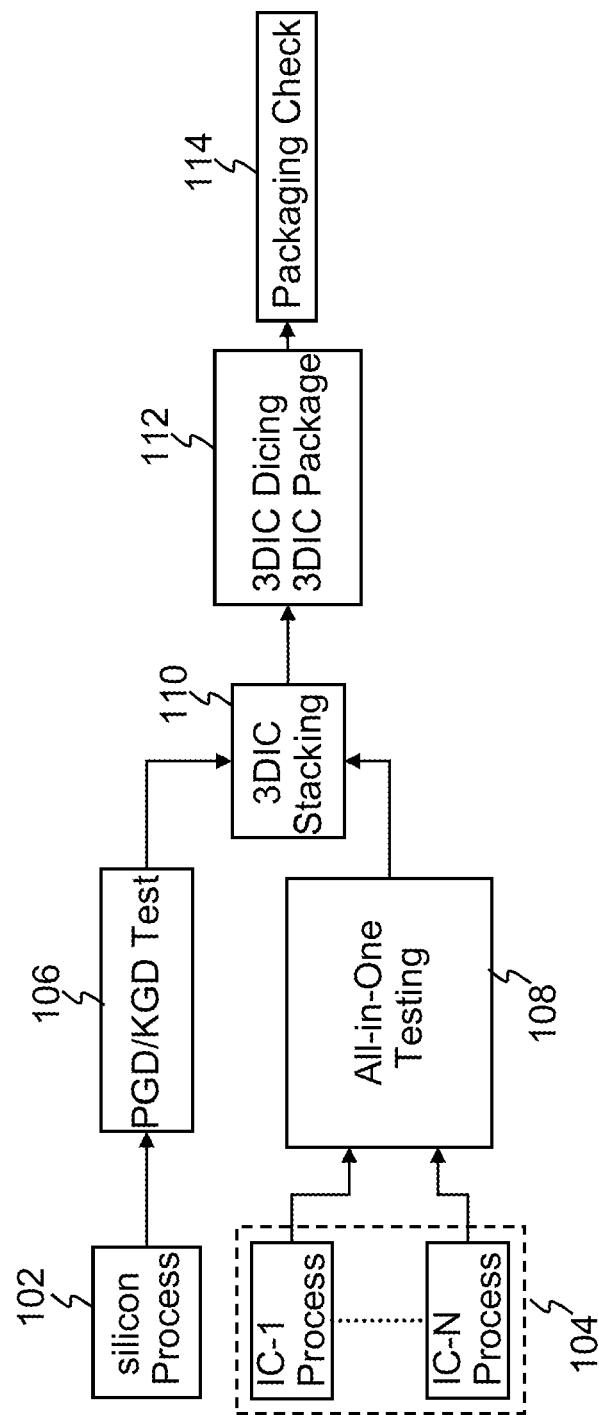
FIG. 1C illustrates a testing flow of a three-dimensional integrated circuit in accordance with various embodiments of the present disclosure.

FIG. 1C illustrates a testing flow of a three-dimensional integrated circuit in accordance with various embodiments of the present disclosure. A three-dimensional integrated circuit device (not shown) may comprise a plurality of semiconductor dies bonded on an interposer. In a conventional testing solution, the plurality of semiconductor dies are bonded on an interposer to form a three dimensional integrated circuit. The three dimensional integrated circuit is subsequently probed by testing equipment to test various system level characteristics. If the three dimensional integrated circuit fails the tests, the plurality of semiconductor dies may be discarded because the rework cost is significant.

The testing flow of FIG. 1C shows an all-in-one test solution to screen out the failed die so as to reduce system level failures. As shown in FIG. 1C, a plurality of semiconductor dies may be fabricated in a silicon process 102. A KGD test may be performed on the plurality of semiconductor dies at step 106. After the semiconductor dies pass the KGD test, the semiconductor dies are designated as known good dies. The known good dies are mounted on a testing substrate.

A device-under-test may be fabricated in a wafer at a fabrication process shown at step 104. Prior to a stacking process, an all-in-one testing process is performed on the device-under-test by probing it through the testing substrate. The detailed structure of the testing apparatus of the all-in-one testing process will be described below with respect to FIGS. 2-13.

Once all semiconductor dies of the three dimensional integrated circuit have passed the tests described above, the semiconductor dies are stacked together or stacked on an interposer depending on different designs and applications at step 110. Subsequently, a dicing process may be performed to form a plurality of individual chip packages at step 112. At step 114, a packaging check may be applied to the individual chip packages.

One advantageous feature of the testing flow shown in FIG. 1C is that the semiconductor dies are tested prior to a stacking process. As such, the system level failure rate may be reduced. The reduced system level failure rate may help to shorten the test cycle time and improve test quality. As a result, the manufacture cost of three-dimensional integrated circuits can be reduced.

Figure 2:
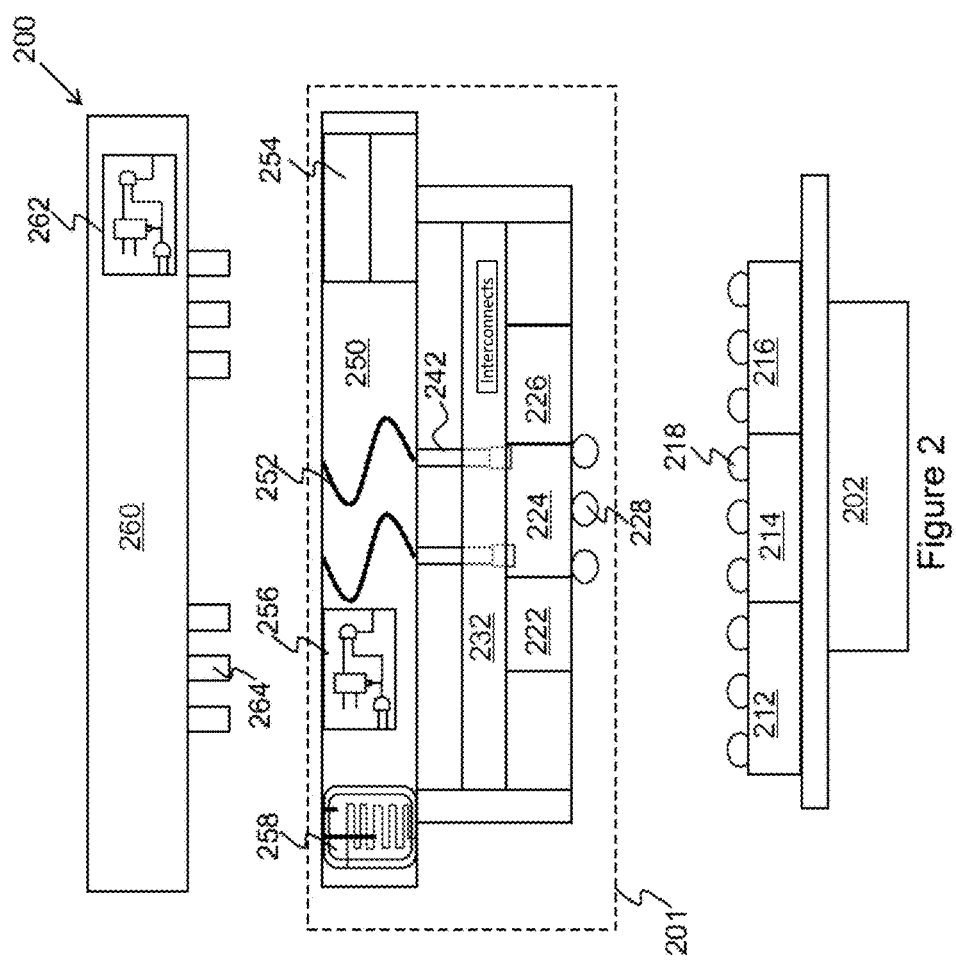
FIG. 2 illustrates a cross sectional view of a three-dimensional integrated circuit testing apparatus in accordance with various embodiments of the present disclosure.

FIG. 2 illustrates a cross sectional view of a three-dimensional integrated circuit testing apparatus in accordance with various embodiments of the present disclosure. The three dimensional integrated circuit testing apparatus 200 includes a device wafer placed on a prober chuck 202, a probe card 201 and an automatic test equipment board 260. The three dimensional integrated circuit testing apparatus 200 can be employed to perform KGD and KGS testing on the device wafer.

As shown in FIG. 2, the device wafer may include a plurality of test chips (e.g., test chip 214), which may be identical to each other. Alternatively, some of test chips may be different from other of the test chips. For simplicity, FIG. 2 illustrates three test chips 212, 214 and 216 on the prober chuck 202.

As shown in FIG. 2, testing pads 218 are formed on the top surface of test chips 212, 214 and 216. In accordance with some embodiments, testing pads 218 are micro-bumps. In alternative embodiments, the testing pads 218 are any suitable connectors such as solder balls, copper bumps, metal pads and/or the like.

The probe card 201 comprises a substrate 232 and a printed circuit board 250. In order to verify the system level characteristics of the test chips 212, 214 and 216, known good dies of a three-dimensional integrated circuit (e.g., known good dies 222 and 226) may be mounted on a first side of the substrate 232. In addition, a plurality of interconnects (not shown) of the three-dimensional integrated circuit are formed in the substrate 232. It should be noted that the first side of the substrate 232 may be commonly known as a front side of the probe card.

Furthermore, the substrate 232 may comprise a dummy die 224. As shown in FIG. 2, there may be a plurality of probe contacts 228 formed over the dummy die 224. Probe contacts 228 of the probe card 201 may have a mirrored pattern of at least some, and possibly all, of testing pads 218. Accordingly, when the probe card 201 is put into contact with test chips such as test chip 214, the probe contacts 228 are in contact with the testing pads 218. The number of probe contacts 228 may be equal to the number of testing pads 218. As a result, during the probing, each of probe contacts 228 is in contact with one testing pad 218. Probe contacts 228 may be in the form of micro-bumps, metal pads, under-bump-metallurgies (UBMs), or any other suitable semiconductor contacts.

As shown in FIG. 2, the substrate 232 may include each semiconductor die and interconnect of the three-dimensional integrated circuit except the test chip. As such, by probing the test chip through the probe contacts 228, the characteristics of the test chip can be tested at a system level without bonding the test chip on the substrate 232.

As shown in FIG. 2, there may be a spring interface between the substrate 232 and the printed circuit board 250. A plurality of pogo pins 242 are mounted on a second side of the substrate 232. Pogo pins 242 may include adjustable and extensible pins that may be retracted slightly when pressed, which pins may also push back when no force is applied. As shown in FIG. 2, one terminal of the pogo pin 242 may contact the connections 252 of the printed circuit board 250. Furthermore, the other terminal of the pogo pin 242 may penetrate through the substrate 232 and contact metal pads formed on the first side of the substrate 232. The metal pads formed on the first side of the substrate 232 may be coupled to the probe contacts 228. In sum, the pogo pins 242 may function as a reliable connection between the printed circuit board 250 and the substrate 232.

In some embodiments, the printed circuit board 250 comprises various testing modules 256, which are employed to perform a variety of electrical characteristic tests such as resistance, capacitance, leakage current, frequency, thermal, stress and the like. Furthermore, the printed circuit board 250 may comprise a thermal heater 258, which is employed to control the temperature of the probe card 201. In addition, the printed circuit board 250 may comprise a variety of system level testing modules such as a processor and/or the like. Alternatively, the printed circuit board 250 may comprise various radio frequency (RF) connectors such as universal serial bus (USB), strain gauge amplifier (SGA) and/or the like.

The ATE 260 may be employed to perform electrical characteristic tests of the test chips. Various testing modules 262 may be employed to perform a variety of electrical characteristic tests such as resistance, capacitance, leakage current, frequency, thermal, stress and the like. During the probing of the test chips such as test chip 214, the test chip 214 is coupled to the probe contacts 228 through the testing pads 218. The probe contacts 228 are bonded on the substrate 232. The substrate 232 may also be secured to the printed circuit board 250, wherein pogo pins 242 provide the electrical connection from the probe contacts 228 to the printed circuit board 250. The printed circuit board 250 further provides a plurality of electrical connections 252 from pogo pins 242 to the ATE 260 through a plurality of pads 264 formed on the ATE 260.

Figure 3:
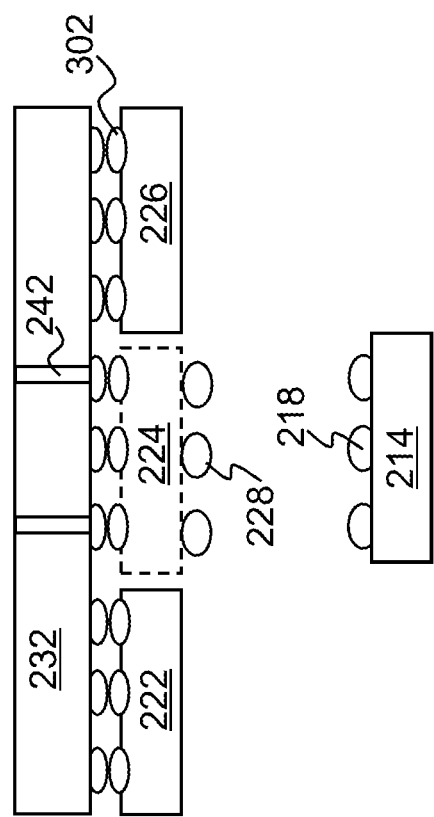
FIG. 3 illustrates in detail a cross-sectional view of the testing substrate and the test chip in accordance with various embodiment of the present disclosure.

FIG. 3 illustrates in detail a cross-sectional view of the testing substrate and the test chip in accordance with various embodiments of the present disclosure. As shown in FIG. 3, known good dies 222 and 226 are mounted on the substrate 232. Probe contacts 228 may be mounted on a dummy die 224, which is mounted on the substrate 232 and further coupled to known good dies through various interconnects (not shown) embedded in the substrate 232. FIG. 3 further shows pogo pins 242 may be connected to the probe contacts 228 through suitable interconnects including micro bumps, conductive interconnects, through vias and/or the like.

Figure 4:
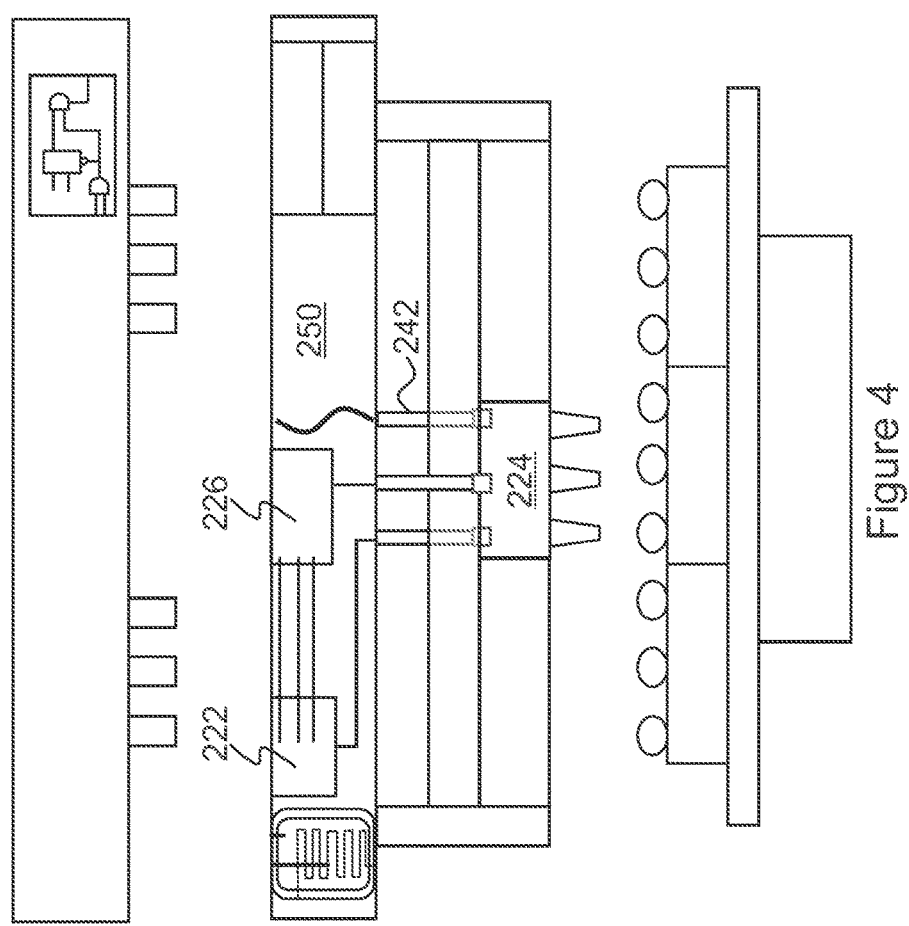
FIG. 4 illustrates a cross sectional view of another three-dimensional integrated circuit testing apparatus in accordance with various embodiments of the present disclosure.

FIG. 4 illustrates a cross sectional view of another three-dimensional integrated circuit testing apparatus in accordance with various embodiments of the present disclosure. The structure of FIG. 4 is similar to the structure shown in FIG. 2 except that known good dies 222 and 226 are mounted on the printed circuit board 250 rather than the substrate 232. It should be noted the side on which the known good dies are bonded is also known as the backside of the probe card.

In accordance with some embodiments, the known good dies 222 and 226 may be of a plurality of bumps, and bonded on the printed circuit board 250 through a reflow process. In alternative embodiments, the known good dies 222 and 226 may be bonded on the printed circuit board 250 through a plurality of bonding pads. Furthermore, a variety of package carriers (not shown) may be employed to accommodate the known good dies 222 and 226. In some embodiments, the package carriers may be semiconductor die sockets, which are mounted on the printed circuit board 250. The known good dies 222 and 226 are disposed in the semiconductor die sockets.

It should be noted that the printed circuit board 250 shown in FIG. 4 may further comprise system level connections between the known good dies 222, 226 and the test chip. Through the system level connections, the system level characteristics of the test chip can be verified.

Figure 5:
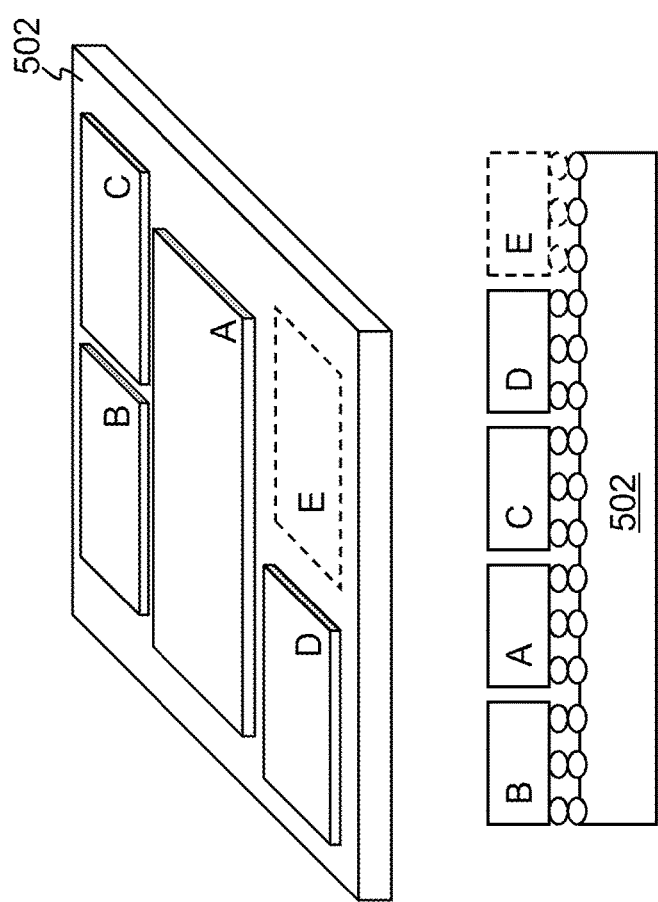
FIG. 5 illustrates a perspective view and a cross sectional view of a test head in accordance with various embodiments of the present disclosure.

FIG. 5 illustrates a perspective view and a cross sectional view of a test head in accordance with various embodiments of the present disclosure. Referring back to FIG. 2 and FIG. 4, the testing substrate portion of the probe card is alternatively referred to as the test head of the probe card.

The test head includes a testing substrate 502 and a variety of known good dies bonded on the testing substrate 502. As shown in FIG. 5, known good dies A, B, C and D are mounted on the testing substrate 502 through micro bumps between the known good dies and the testing substrate 502. The dashed rectangle E represents a test interface for KGS testing. There may be a plurality of probe contacts (not shown but illustrated in FIG. 8) formed over the region of dashed rectangle E. As shown in the cross section view, the probe contacts and the known good dies are coupled to each other through various interconnects formed in the testing substrate 502.

Figure 6:
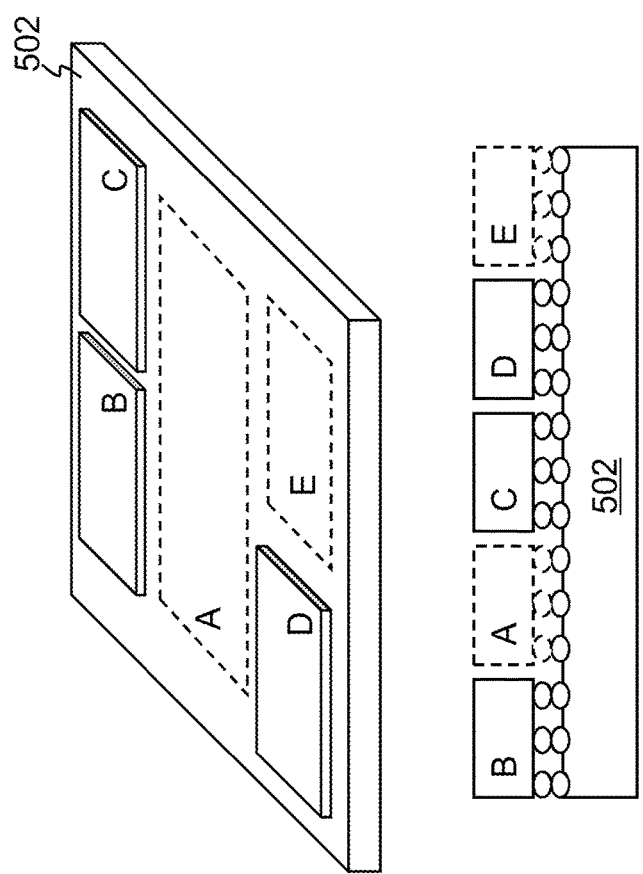
FIG. 6 illustrates a perspective view and a cross sectional view of another test head in accordance with various embodiments of the present disclosure.

FIG. 6 illustrates a perspective view and a cross sectional view of another test head in accordance with various embodiments of the present disclosure. The test head structure shown in FIG. 6 is similar to that shown in FIG. 5 except that there may be two test interfaces formed over the testing substrate 502. The second test interface (dashed rectangle A) is of a same structure as the first test interface (dashed rectangle E), and hence is not discussed again to avoid repetition.

Figure 7:
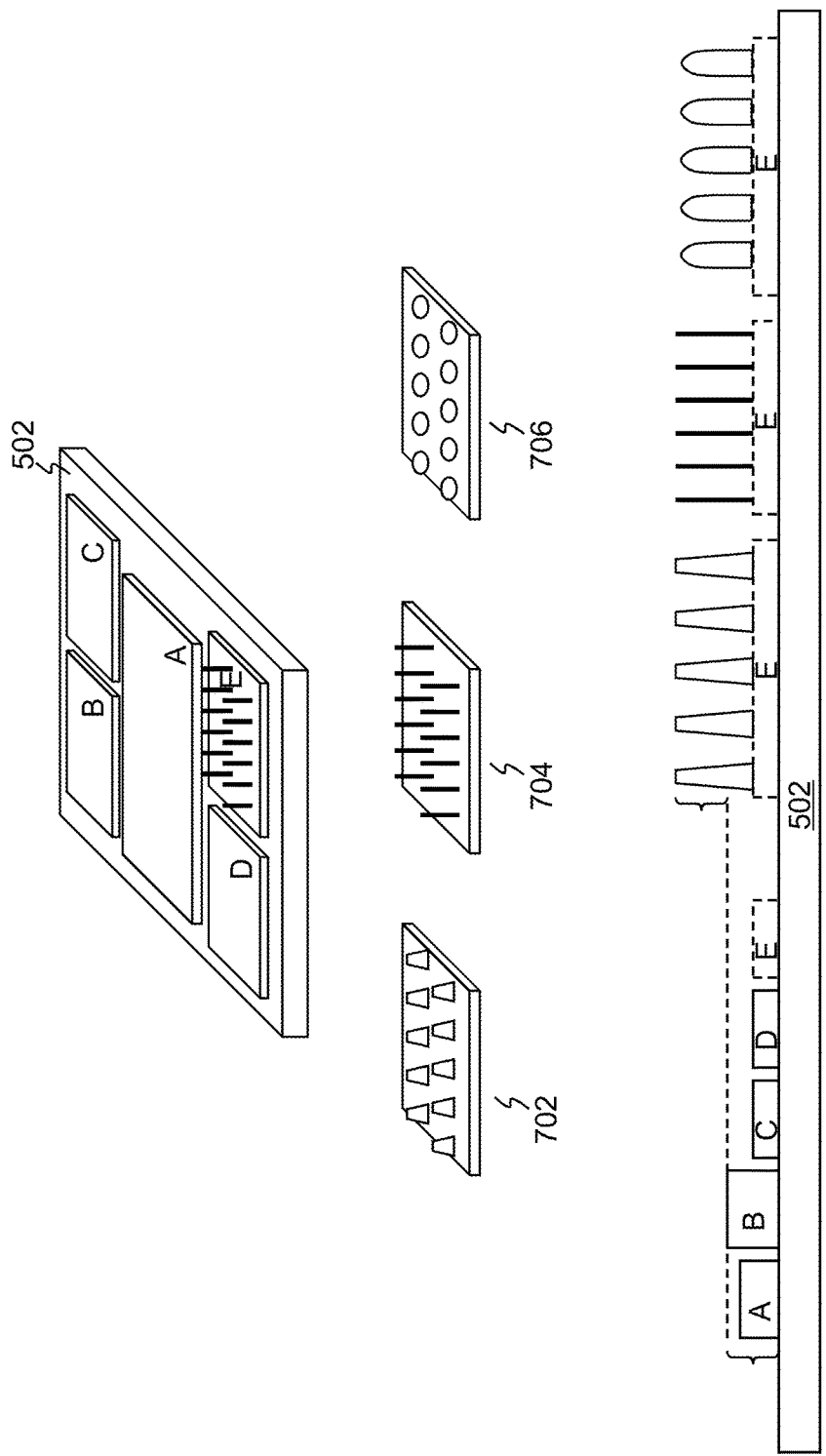
FIG. 7 illustrates a perspective view and a cross sectional view of yet another test head in accordance with various embodiments of the present disclosure.

FIG. 7 illustrates a perspective view and a cross sectional view of yet another test head in accordance with various embodiments of the present disclosure. The probe contacts are mounted on the testing substrate 502 through a dummy die E. The probe contacts may be of a variety of shapes. As shown in FIG. 7, the probe contacts 702 may be of a trapezoidal shape. The probe contacts 704 may be a needle shape. The probe contacts 706 may be pillar bumps. A person skilled in the art will recognize that the shapes of the probe contacts described above are merely examples and are not meant to limit the current embodiments. Other probe contact shapes or structures such as contactless probe contacts, hybrid probe contacts and/or the like, may alternatively be used.

The cross sectional view shown in FIG. 7 illustrates the height of the probe contacts may be greater than the height of the known good dies on the testing substrate 502. In some embodiments, the total height of the probe contacts and the dummy die E is about 100 um. The height of the tallest known good die (e.g., known good die B shown in the cross sectional view) is in a range from about 50 um to about 100 um.

Figure 8:
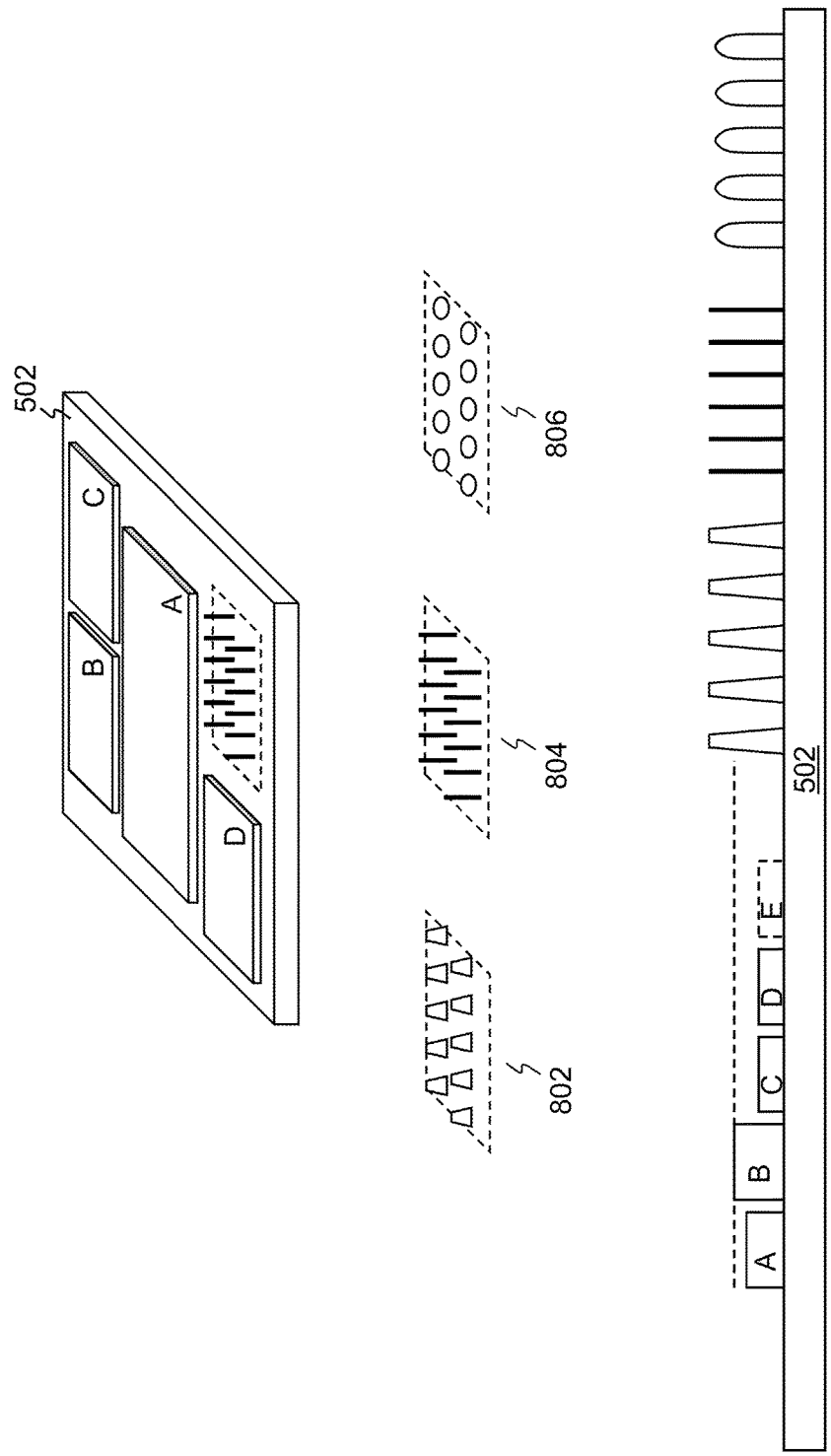
FIG. 8 illustrates a perspective view and a cross sectional view of yet another test head in accordance with various embodiments of the present disclosure.

FIG. 8 illustrates a perspective view and a cross sectional view of yet another test head in accordance with various embodiments of the present disclosure. The test head structure shown in FIG. 8 is similar to that shown in FIG. 7 except that the probe contacts 802, 804 and 806 may be mounted on the testing substrate 502 directly. In order to maintain the relationship that the height of the probe contacts is greater than the height of the tallest known good die, taller probe contacts may be employed accordingly.

Figure 9:
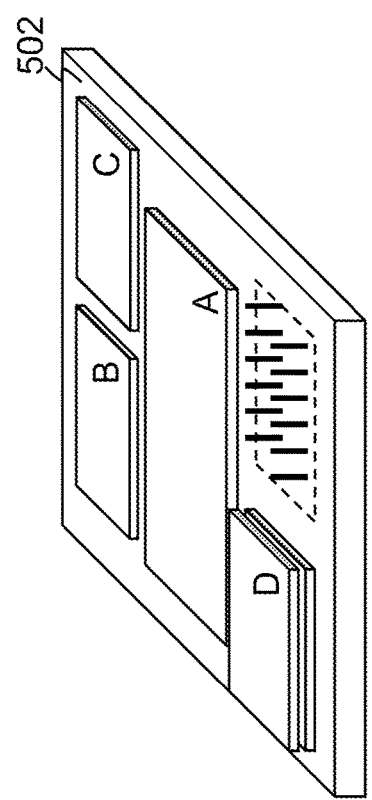
FIG. 9 illustrates a perspective view of yet another test head in accordance with various embodiments of the present disclosure.

FIG. 9 illustrates a perspective view of yet another test head in accordance with various embodiments of the present disclosure. The test head structure shown in FIG. 9 is similar to that shown in FIG. 8 except that some known good dies may be stacked together. For example, the known good die D may include two semiconductor dies stacked together. The selection of the probe contacts in FIG. 9 is similar to that of FIG. 8, and hence is not discussed herein to avoid repetition.

Figure 10:
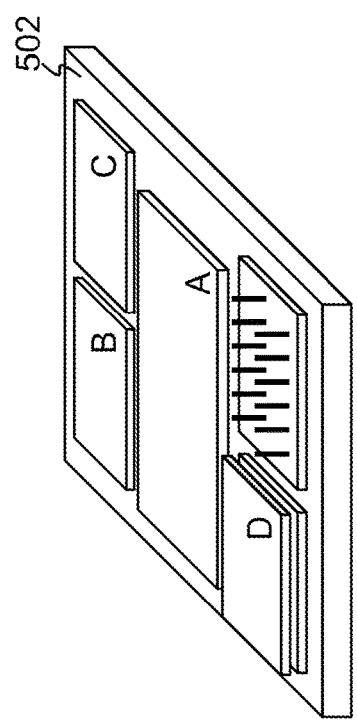
FIG. 10 illustrates a perspective view of yet another test head in accordance with various embodiments of the present disclosure.

FIG. 10 illustrates a perspective view of yet another test head in accordance with various embodiments of the present disclosure. The test head structure shown in FIG. 10 is similar to that shown in FIG. 9 except that the probe contacts are mounted on a dummy die. By employing the dummy die, relatively short probe contacts may be used as a result.

Figure 11:
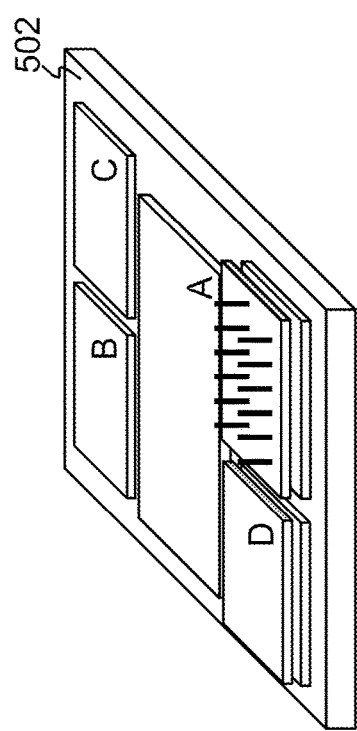
FIG. 11 illustrates a perspective view of yet another test head in accordance with various embodiments of the present disclosure.

FIG. 11 illustrates a perspective view of yet another test head in accordance with various embodiments of the present disclosure. The test head structure shown in FIG. 11 is similar to that shown in FIG. 10 except that the probe contacts are mounted on a structure having two dummy dies stacked together. The selection of the probe contacts in FIG. 11 is similar to that of FIG. 10, and hence is not discussed herein to avoid repetition.

Figure 12:
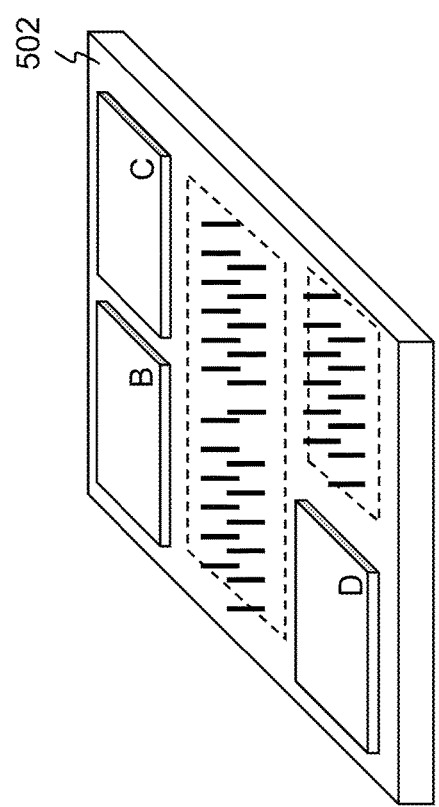
FIG. 12 illustrates a perspective view of yet another test head in accordance with various embodiments of the present disclosure.

FIG. 12 illustrates a perspective view of yet another test head in accordance with various embodiments of the present disclosure. The test head structure shown in FIG. 12 is similar to that shown in FIG. 8 except that multiple test chips may be probed in parallel. In comparison with the structure shown in FIG. 8, the probe contacts are mounted on two different locations of the testing substrate 502. A first group of probe contacts may be of a mirrored pattern of the testing pads of a first test chip. A second group of probe contacts may be of a mirrored pattern of the testing pads of a second test chip. As such, the first test chip and the second test chip may be tested concurrently.

One advantageous feature of the testing head shown in FIG. 12 is that the efficiency of probing may be improved by probing multiple test chips concurrently. The improved efficiency of probing helps to further reduce the test cycle time of three-dimensional integrated circuits.

Figure 13:
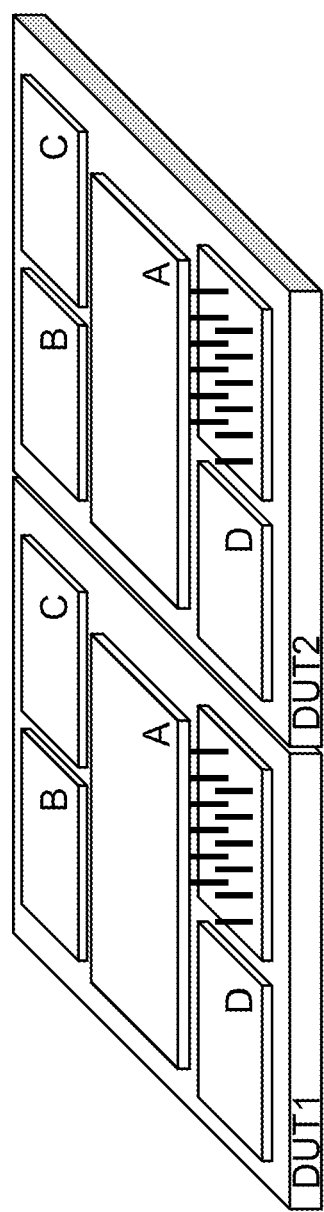
FIG. 13 illustrates a perspective view of yet another test head in accordance with various embodiments of the present disclosure.

FIG. 13 illustrates a perspective view of yet another test head in accordance with various embodiments of the present disclosure. The test head structure shown in FIG. 13 may include two testing substrate s. Each testing substrate is of a structure similar to that shown in FIG. 7. By employing two testing substrate s shown in FIG. 13, two test chips may be tested in parallel during a probing process.

One advantageous feature of the testing head shown in FIG. 13 is that the efficiency of probing is improved. The improved efficiency of probing helps to further reduce the test cycle time of three-dimensional integrated circuits.

Although embodiments of the present disclosure and its advantages have been described in detail, it should be understood that various changes, substitutions and alterations can be made herein without departing from the spirit and scope of the disclosure as defined by the appended claims.

In accordance with an embodiment, an apparatus comprises a probe card configured to couple a device-under-test of a three-dimensional integrated circuit with an automatic testing equipment board having a plurality of testing modules, wherein the probe card comprises a plurality of known good dies of the three-dimensional integrated circuit, a plurality of interconnects of the three-dimensional integrated circuit and a plurality of probe contacts, wherein the probe contacts are configured to couple the probe card with testing contacts of the device-under-test of the three-dimensional integrated circuit.

In accordance with another embodiment, a system comprises a plurality of testing modules on an automatic testing equipment board and a probe card coupled comprising a plurality of known good dies of a three-dimensional integrated circuit, a plurality of interconnects of the three-dimensional integrated circuit, a printed circuit board coupled to the automatic testing equipment board, a testing substrate comprising a first group of probe contacts, wherein the first group of probe contacts are configured to couple the probe card with testing contacts of a first device-under-test of the three-dimensional integrated circuit and a plurality of pogo pins, wherein a first end of the pogo pin penetrates through the testing substrate and a second end of the pogo pin is coupled to the printed circuit board.

In accordance with yet another embodiment, a method comprises bonding a plurality of known good dies of a three-dimensional integrated circuit on a probe card, forming a plurality of probe contacts on a testing substrate of the probe card, wherein the probe contacts are coupled to the known good dies through a plurality of interconnects, wherein the interconnects form a same system level connection as the three-dimensional integrated circuit and performing a probing on a semiconductor die of a wafer through the probe card.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
 a probe card configured to couple a device-under-test of a three-dimensional integrated circuit with an automatic testing equipment board having a plurality of testing modules, wherein the probe card comprises:
 a testing substrate coupled to the automatic testing equipment board through a plurality of pogo pins and a printed circuit board;
 a plurality of known good dies on a first side of the testing substrate;
 a plurality of interconnects formed in the testing substrate, wherein the plurality of interconnects have a same interconnection as interconnects of the three-dimensional integrated circuit; and
 a dummy die having a plurality of probe contacts, wherein the probe contacts are configured to couple the probe card with testing contacts of the device-under-test of the three-dimensional integrated circuit, and wherein the plurality of probe contacts have a mirrored pattern of the testing contacts of the device-under-test of the three-dimensional integrated circuit, and wherein the plurality of known good dies, the device-under-test and the plurality of interconnects are configured to form the three-dimensional integrated circuit.

2. The apparatus of claim 1, wherein:
 the printed circuit board is coupled between the testing substrate and the automatic testing equipment board.

3. The apparatus of claim 2, wherein the printed circuit board comprises:
 a thermal heater, wherein a temperature of the testing substrate is controlled through adjusting the thermal heater; and
 a plurality of components for system level tests.

4. A system comprising:
 a plurality of testing modules on an automatic testing equipment board; and
 a probe card comprising:

a testing substrate;
a plurality of known good dies of a three-dimensional integrated circuit;
a plurality of interconnects of the three-dimensional integrated circuit;
a printed circuit board coupled to the automatic testing equipment board;
a dummy semiconductor die having a first group of probe contacts formed on a first side of the dummy semiconductor die, wherein the first group of probe contacts are configured to couple the probe card with testing contacts of a first device-under-test of the three-dimensional integrated circuit; and
a plurality of pogo pins, wherein:
 a first end of the pogo pin penetrates through the testing substrate; and
 a second end of the pogo pin is coupled to the printed circuit board.

5. The system of claim 4, wherein the testing substrate comprises:
the plurality of known good dies of the three-dimensional integrated circuit; and
the plurality of interconnects of the three-dimensional integrated circuit.

6. The system of claim 4, wherein:
a height of the first group of probe contacts is of a first dimension; and
a height of a tallest known good die is of a second dimension, wherein the first dimension is greater than the second dimension.

7. The system of claim 4, wherein:
the first group of probe contacts are mounted on the dummy semiconductor die, and wherein the dummy semiconductor die is of a thickness similar to a thickness of the known good dies.

8. The system of claim 4, further comprising:
a second group of probe contacts, wherein the second group of probe contacts are configured to couple the probe card with testing contacts of a second device-under-test of the three-dimensional integrated circuit, and wherein the first device-under-test and the second device-under-test are tested concurrently through the first group of probe contacts and the second group of probe contacts.

9. A system comprising:
an automatic testing equipment board comprising a plurality of testing modules; and
a probe card comprising a printed circuit board coupled to the automatic testing equipment board, a testing substrate electrically coupled to the printed circuit board through a plurality of pogo pins, a plurality of known good dies of a three-dimensional integrated circuit on a first side of the testing substrate and a dummy die on the first side of the testing substrate, wherein:
 the testing substrate comprises a plurality of interconnects of the three-dimensional integrated circuit; and
 a plurality of probe contacts are on the dummy die, and wherein the plurality of probe contacts are configured to couple the probe card with testing contacts of a device-under-test of the three-dimensional integrated circuit and the plurality of pogo pins penetrates through the testing substrate and is in contact with the dummy die.

10. The system of claim 9, wherein:
the probe card includes all semiconductor dies and interconnects of the three-dimensional integrated circuit except the device-under-test.

11. The system of claim 9, wherein:
terminals of the pogo pins penetrate through the testing substrate and contact metal pads on the first side of the testing substrate.

12. The system of claim 11, wherein:
the contact metal pads are electrically coupled to the probe contacts.

13. The system of claim 9, wherein:
the device-under-test includes a plurality of testing pads.

14. The system of claim 13, wherein:
the probe contacts have a mirrored pattern of the testing pads.

15. The apparatus of claim 1, wherein the plurality of pogo pins is in contact with electrical connections of the printed circuit board and the dummy die.

16. The apparatus of claim 15, wherein the plurality of pogo pins is in contact with metal pads formed on the testing substrate.

17. The apparatus of claim 16, wherein the testing substrate is electrically coupled to the printed circuit board through the plurality of pogo pins.

18. The apparatus of claim 16, wherein the printed circuit board is over a second side of the testing substrate.

19. The apparatus of claim 18, wherein the plurality of pogo pins penetrate from the second side of the testing substrate to the first side of the testing substrate.

* * * * *